(12) United States Patent
Hsieh et al.

(10) Patent No.: US 9,559,036 B1
(45) Date of Patent: Jan. 31, 2017

(54) INTEGRATED CIRCUIT PACKAGE WITH PLATED HEAT SPREADER

(71) Applicant: Altera Corporation, San Jose, CA (US)

(72) Inventors: Steven Hsieh, Cupertino, CA (US); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/450,136

(22) Filed: Aug. 1, 2014

(51) Int. Cl.
| H01L 21/50 | (2006.01) |
| H01L 21/56 | (2006.01) |
| H01L 23/36 | (2006.01) |
| H01L 23/367 | (2006.01) |
| H01L 23/31 | (2006.01) |
| H01L 23/373 | (2006.01) |
| H01L 21/48 | (2006.01) |
| H01L 27/02 | (2006.01) |

(52) U.S. Cl.
CPC ......... *H01L 23/367* (2013.01); *H01L 21/4882* (2013.01); *H01L 21/565* (2013.01); *H01L 23/3114* (2013.01); *H01L 23/3735* (2013.01); *H01L 23/3736* (2013.01); *H01L 27/0248* (2013.01)

(58) Field of Classification Search
CPC ...... H01L 21/486; H01L 21/56; H01L 21/563; H01L 23/142; H01L 23/3114; H01L 23/3121; H01L 23/3135; H01L 23/3157; H01L 23/3192; H01L 23/36; H01L 23/3672; H01L 23/3675; H01L 23/49822; H01L 23/5389; H01L 24/97
See application file for complete search history.

(56) References Cited

U.S. PATENT DOCUMENTS

| 3,644,798 | A | 2/1972 | Ihochi | |
| 4,758,926 | A | 7/1988 | Herrell et al. | |
| 4,860,444 | A | 8/1989 | Herrell et al. | |
| 5,325,265 | A | 6/1994 | Turlik et al. | |
| 6,140,150 | A | 10/2000 | Efland et al. | |
| 6,140,702 | A | 10/2000 | Efland et al. | |
| 7,371,610 | B1 | 5/2008 | Fan et al. | |
| 7,776,648 | B2 * | 8/2010 | Chua | H01L 23/16 257/706 |
| 2002/0068378 | A1 | 6/2002 | McLellan et al. | |
| 2004/0264136 | A1 * | 12/2004 | Houle | H01L 23/373 361/704 |
| 2005/0095875 | A1 * | 5/2005 | Huang | H01L 21/561 438/800 |
| 2006/0194370 | A1 * | 8/2006 | Lee et al. | 438/118 |

(Continued)

*Primary Examiner* — Pamela E Perkins

(57) ABSTRACT

An integrated circuit package may include an integrated circuit die with lower and upper surfaces. The integrated circuit die is mounted on a package substrate. An underfill material is deposited between the integrated circuit die and the package substrate. A molding compound may be injected to surround the integrated circuit die while leaving the upper surface of the integrated circuit die exposed. The integrated circuit package further includes a metal layer that contacts the exposed upper surface of the integrated circuit die. The metal layer may also cover the molding compound. If desired, an additional metal layer may be formed on the layer of metal as a heat spreader. Such a configuration may also be applicable for wire bond packages, in which the metal layers are formed on an overmold that is disposed over a wire-bonded integrated circuit die on a package substrate.

11 Claims, 8 Drawing Sheets

(56) References Cited

U.S. PATENT DOCUMENTS

| | | | |
|---|---|---|---|
| 2009/0194868 A1* | 8/2009 | Chong | H01L 21/561 257/712 |
| 2012/0171814 A1* | 7/2012 | Choi et al. | 438/107 |
| 2013/0299955 A1* | 11/2013 | Chang | H01L 24/97 257/675 |
| 2014/0175599 A1 | 6/2014 | Romig et al. | |

* cited by examiner

US 9,559,036 B1

INTEGRATED CIRCUIT PACKAGE WITH PLATED HEAT SPREADER

BACKGROUND

In a semiconductor device assembly, an integrated circuit die (also referred to as a semiconductor chip or "die") may be mounted on a packaging substrate. The integrated circuit die generates heat when electrical current flows through the integrated circuit die. As such, passive and active thermal management devices are used to minimize potentially damaging effects of heat on the device. Such thermal management devices include heat spreading lids, heat sinks, etc. Typically, a heat conducting material is also used to facilitate heat transfer within the package. For example, a thermal interface material (TIM) may be deposited between the integrated circuit die and the heat spreading lid to enhance heat transfer from the integrated circuit die to the heat spreading lid.

However, device packages using TIM may have problems meeting heat dissipation requirements. A conventional TIM is typically made from material with low thermal conductance, such as silicone or epoxy. The thermal conductance of TIM is substantially lower than that of a good thermal conducting metal (e.g., copper), which may result in lower efficiency of heat transfer. For example, the thermal conductivity of the TIM is about 3.8 watts per meter kelvin (W/m-k) while the thermal conductivity of a good heat conductor, such as copper, is about 401 W/m-k. Generally, a low thermal conductivity indicates that a material is a poor conductor of heat, which means the TIM may impede heat transfer from the integrated circuit die.

The presence of air in TIM may also reduce the thermal conductance of the TIM. The thermal conductivity of air is typically lower than the TIM. For example, the thermal conductivity of air is about 0.025 W/m-k. Such low thermal conductance may result in low efficiency of heat transfer. The creation of air bubbles or trapping of air pockets in the TIM usually occurs during the lid attach process. For example, an incorrectly-fitted heat spreading lid over the integrated circuit die may cause trapping of air pockets in the TIM. As such, the heat transfer efficiency of the TIM may be reduced.

SUMMARY

In accordance with the present invention, apparatuses and methods are provided for creating an integrated circuit package with a plated heat spreader.

It is appreciated that the present invention can be implemented in numerous ways, such as a process, an apparatus, a system, or a device. Several inventive embodiments of the present invention are described below.

A method for packaging an integrated circuit die is provided. The method may include mounting the integrated circuit die on a package substrate to form an integrated circuit package. A molding compound is injected to surround the integrated circuit die while leaving an upper surface of the integrated circuit die exposed. The molding compound and the integrated circuit die are then covered with a plating metal layer, which contacts the upper surface of the integrated circuit die. The plating metal layer is formed through a plating process. The plating metal layer may facilitate heat transfer from the integrated circuit die to dissipate heat out of the integrated circuit package.

A method of assembling an integrated circuit package is disclosed. The method includes attaching an integrated circuit die to a package substrate. Bond wires are attached between the integrated circuit die and the package substrate. An overmold may encapsulate the integrated circuit die and the package substrate, and the wires. The method further includes bonding wires to the integrated circuit die and the package substrate and encapsulating the integrated circuit die, package substrate and the wires with an overmold. The overmold is then contacted with the heat spreading lid.

An integrated circuit package produced by a process is disclosed. The process of producing an integrated circuit package may also include the steps of providing a package substrate and an integrated circuit die, in which the integrated circuit die is attached to the package substrate. The process of producing the integrated circuit package may also include the step of contacting a layer of metal on a back surface of the integrated circuit die. The layer of metal may include first and second heat conducting layers. The first heat conducting layer is formed directly on the back surface of the integrated circuit die through a sputtering process and the second heat conducting layer is formed over the first heat conducting layer through a plating process. If desired, an additional layer of metal may be formed above the layer of metal. The additional layer of metal forms a heat spreading lid for the integrated circuit package.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques for creating an integrated circuit package with a plated heat spreader.

It will be obvious, however, to one skilled in the art that the present exemplary embodiments may be practiced without some or all of these specific details described with reference to the respective embodiments. In other instances, well-known operations have not been described in detail in order not to obscure unnecessarily the present embodiments.

Figure 1:
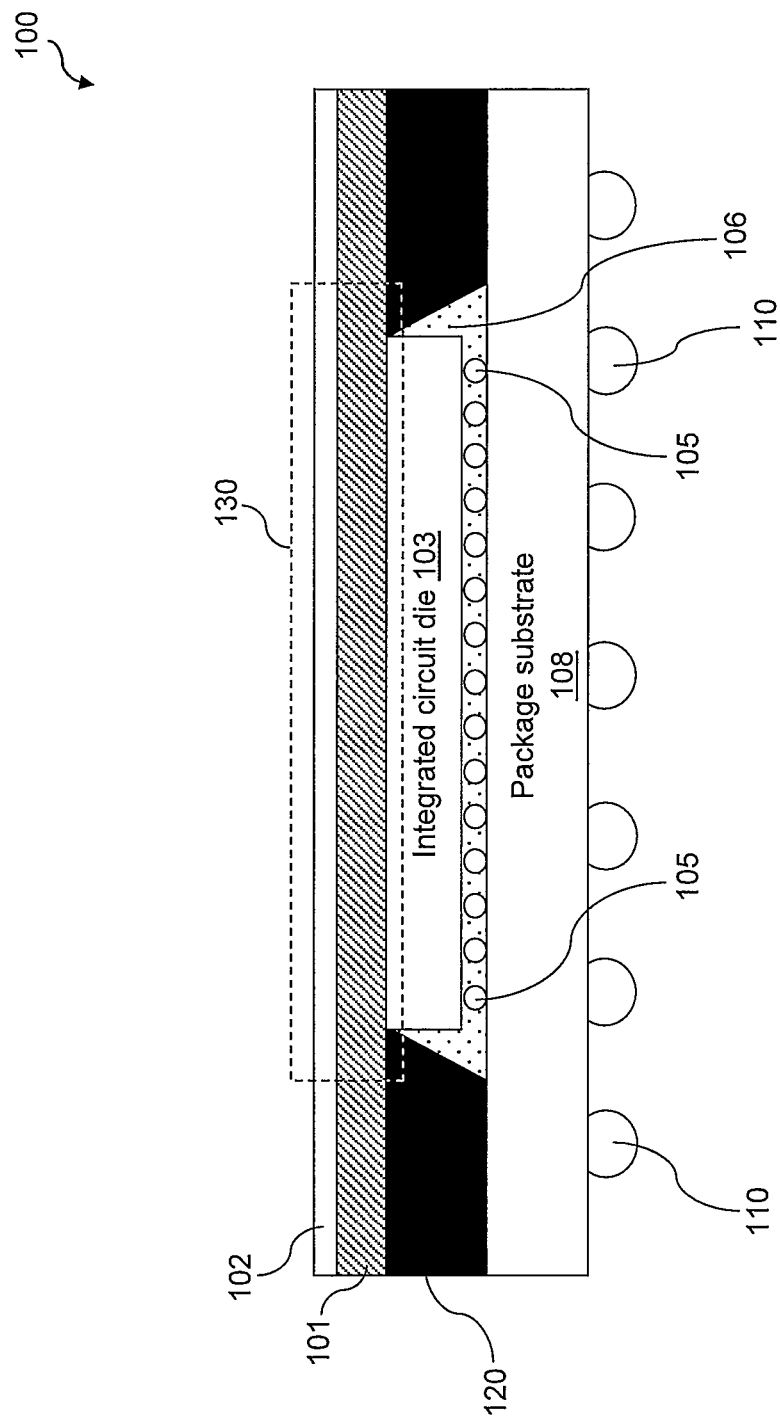
FIG. 1 shows a side view of an illustrative integrated circuit package having a metal layer contacting an integrated circuit die and a molding compound, in accordance with an embodiment of the present invention.

FIG. 1 shows a side view of an illustrative integrated circuit package 100 having metal layer 101 contacting integrated circuit die 103 and molding compound 120, in accordance with an embodiment of the present invention. Integrated circuit die 103 may be mounted on package substrate 108. In one embodiment, integrated circuit die 103 has a lower surface that is coupled to package substrate 108 via microbumps 105. The lower surface serves as an active surface of integrated circuit die 103 in which transistors (not shown) are formed. Accordingly, solder balls 110 may be soldered to an opposing surface of package substrate 108. Solder balls 110 may provide electrical connection from integrated circuit package 100 to a printed circuit board (not shown), which may also host other circuits. Underfill 106 is dispensed to fill the gap between integrated circuit die 103 and package substrate 108, so as to improve bonding between integrated circuit die 103 and package substrate 108.

In one embodiment, integrated circuit die 103 may be encapsulated within a molding compound (e.g., molding compound 120). Molding compound 120 protects integrated circuit die 103 and its electrical connections (not shown) from breakage and hazardous environmental contaminants. Molding compound 120 may be any suitable material, and in one embodiment may be composed of a mixture of epoxy resin and ceramic filler material.

A layer of heat conducting metal (e.g., metal layer 101) may then be formed on integrated circuit die 103 and molding compound 120. In the example of FIG. 1, metal layer 101 is in contact with the upper surface of integrated circuit 103. For example, metal layer 101 may be fabricated from a metal with high thermal conductivity such as aluminum and copper. If desired, an additional layer of heat conducting metal (e.g., metal layer 102) may be plated above metal layer 101 to replicate the look and/or function of a heat spreading lid. Metal layers 101 and 102 may reduce cooling time of integrated circuit die 103 by improving heat transfer from integrated circuit die 103. A more detailed description of metal layers 101 and 102, highlighted by region 130, will be described below with reference to FIG. 2.

Figure 2:
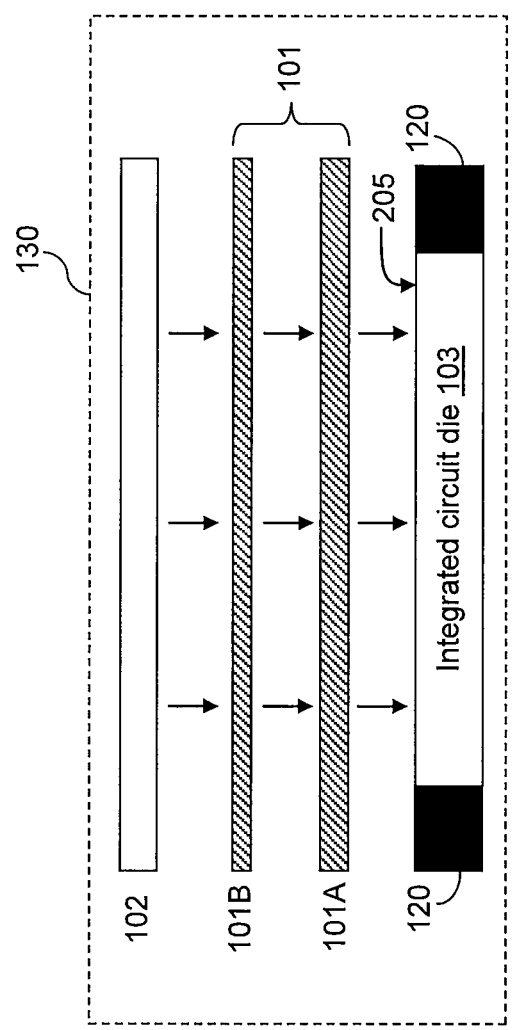
FIG. 2 shows a side view of a region of the integrated circuit package shown in FIG. 1, in accordance with one embodiment of the present invention.

FIG. 2 shows a side view of region 130 of integrated circuit package 100 shown in FIG. 1, in accordance with one embodiment of the present invention. Region 130 may include integrated circuit die 103, molding compound 120, and metal layers 101 and 102. In one scenario, it may be advantageous to form metal layer 101 substantially evenly on the surface of the integrated circuit die and the molding compound (if present). Such a scenario may prevent the formation of air pockets or air bubbles in metal layer 101.

In one embodiment, metal layer 101 may have two different layers (e.g., heat conducting layer 101A and heat conducting layer 101B). Heat conducting layer 101A may be deposited on an upper surface (e.g., surface 205) of integrated circuit die 103 and molding compound 120 using sputtering deposition. Alternatively, heat conducting layer 101A may be deposited via plating. For example, heat conducting layer 101A may be a copper seed layer or an aluminum seed layer.

Heat conducting layer 101B may be formed directly and evenly above heat conducing layer 101A via plating. For example, heat conducing layer 101B may be a metal layer that is formed from copper. The thickness of heat conducting layer 101B may be adjusted to control thermal conductivity of heat conducting layer 101B. In one embodiment, the thickness of heat conducting layer 101B may be about 200 to 500 micrometer (μm). If desired, an additional metal layer (e.g., metal layer 102) may be deposited over metal layer 101 via plating to replicate the look and/or function of a heat spreading lid. For example, metal layer 102 may be formed from nickel.

Figure 3:
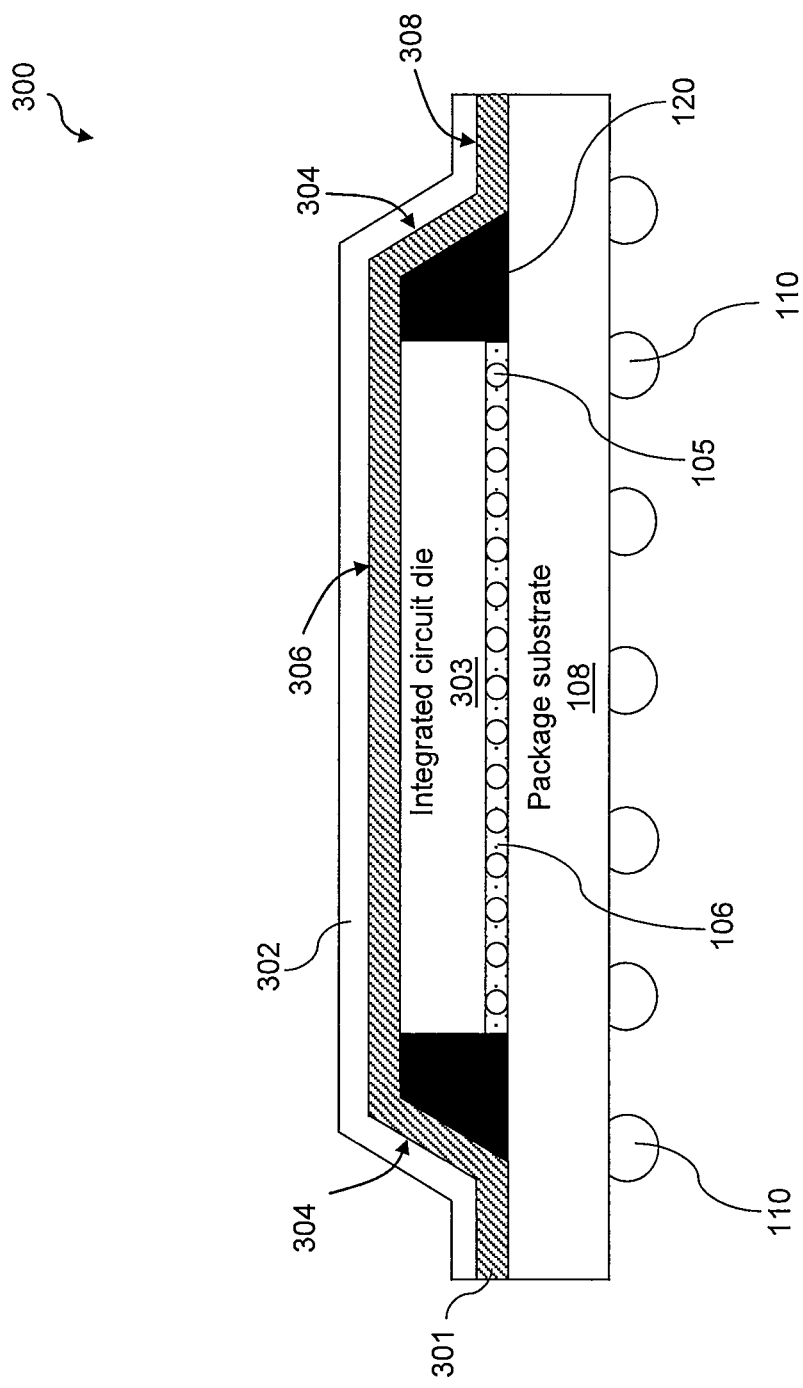
FIG. 3 shows a side view of an illustrative integrated circuit package with two metal layers having sloped side walls over an integrated circuit die and molding compound, in accordance with an embodiment of the present invention.

The present invention may be implemented in different integrated circuit package configurations. FIG. 3 shows a side view of an illustrative integrated circuit package 300 with metal layers 301 and 302 having sloped side walls 304 over integrated circuit die 303 and molding compound 120, in accordance with an embodiment of the present invention. It should be appreciated that integrated circuit package 300 may share similar elements with integrated circuit package 100 of FIG. 1. As such, for the sake of brevity, elements that have been described above, such as microbumps 105, underfill 106, package substrate 108, and solder balls 110, will not be described in detail.

As shown in FIG. 3, metal layer 301 is used to cover integrated circuit die 303 and molding compound 120. In one embodiment, a portion of metal layer 301 may form sloped side walls 304. Such a configuration may be referred to as a "hat-shaped" metal layer. As an example, the "hat-shaped" metal layer has a flat surface (e.g., surface 306) with sloped side walls (e.g., side walls 304) having an angle that is formed complementary to the shape of molding compound 120. Additionally, a lip (e.g., lip 308), which resembles the brim of a hat, may extend outwardly from the bottom of side walls 304. Metal layer 301 may facilitate the dissipation of heat generated by integrated circuit die 303. If desired, an additional layer of metal (e.g., metal layer 302) may be plated on metal layer 301 to provide the look of a conventional lid as well as to protect integrated circuit die 303 from external contaminants.

Metal layer 301 is fabricated similar to metal layer 101 illustrated in FIG. 2. Metal layer 301 may have two different layers (e.g., heat conducting layer 101A and 101B of FIG. 2) formed on the back surface (e.g., non-active surface) of integrated circuit die 303 via sputtering deposition and plating, respectively.

Figure 4:
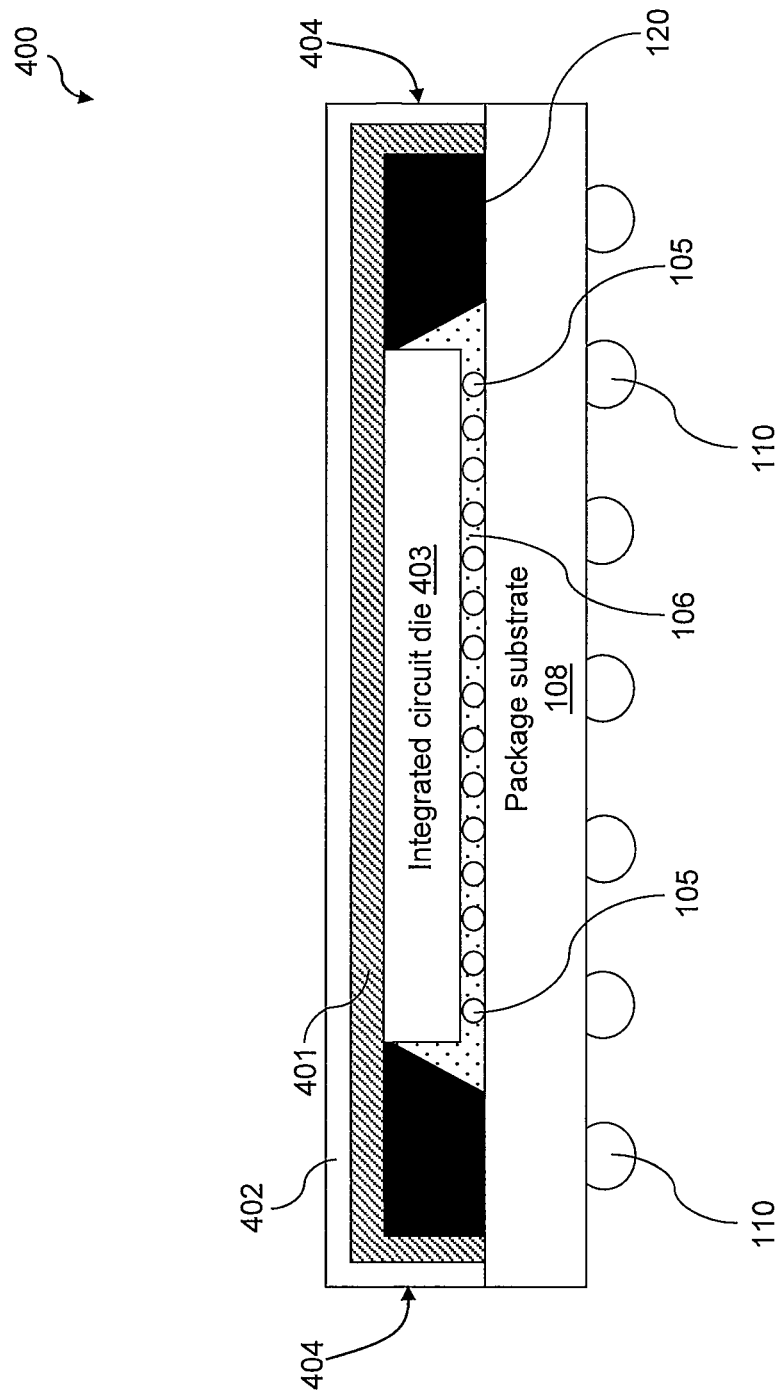
FIG. 4 shows a side view of an illustrative integrated circuit package with two metal layers having vertical side walls formed over an integrated circuit die and molding compound, in accordance with an embodiment of the present invention.

FIG. 4 shows a side view of an illustrative integrated circuit package 400 with metal layers 401 and 402 having vertical side walls 404 over integrated circuit die 403 and molding compound 120, in accordance with an embodiment of the present invention. It should be appreciated that integrated circuit package 400 may share similar elements with integrated circuit packages 100 and 300 of FIGS. 1 and 3. As such, for the sake of brevity, elements that have been described above, such as microbumps 105, underfill 106, package substrate 108, and solder balls 110, will not be described in detail.

As shown in FIG. 4, metal layer 401 is used to cover integrated circuit die 403 and molding compound 120. In one embodiment, a portion of metal layer 401 may form vertical side walls 404. Such a configuration may be referred to as a "rectangular-shaped" metal layer. The rectangular shape of metal layer 401 may allow for efficient heat transfer across the entire surface of integrated circuit die 403. Additionally, metal layer 402 may be plated over metal layer 401 and may share similar functions with the above-described metal layer 302 of FIG. 3.

Figure 5:
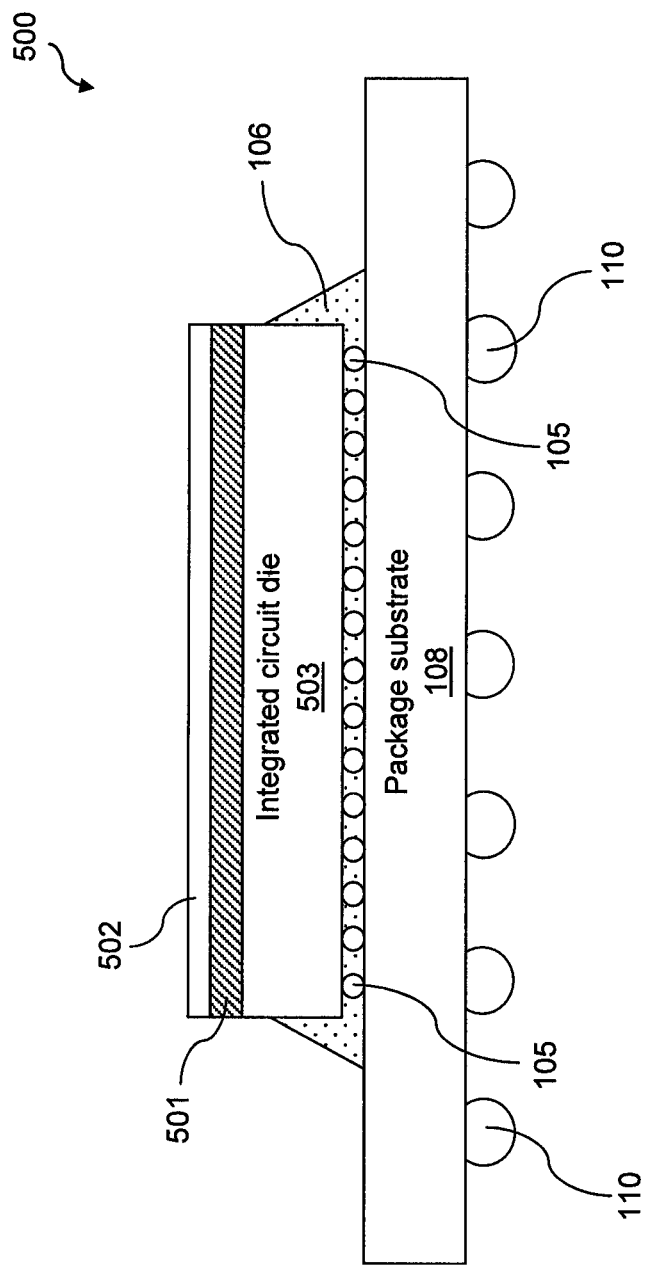
FIG. 5 shows a side view of an illustrative integrated circuit package without molding compound, in accordance with an embodiment of the present invention.

In some scenarios, integrated circuit packages with a relatively large integrated circuit die or device may be provided. FIG. 5 shows a side view of an illustrative integrated circuit package 500 without molding compound, in accordance with an embodiment of the present invention. It should be appreciated that integrated circuit package 500 may share similar elements with integrated circuit package 100 of FIGS. 1 and 2. As such, for the sake of brevity, elements that have been described above, such as microbumps 105 and solder balls 110, will not be described in detail.

Large-sized integrated circuit dies such as integrated circuit die 503 may be assembled in an integrated circuit package (e.g., integrated circuit package 500). For example, integrated circuit die 503 is mounted on package substrate 108, followed by reflow soldering to connect microbumps 105 to integrated circuit die 503 and package substrate 108. Subsequently, the gap between integrated circuit die 503 and package substrate 108 may be filled with underfill 106 under a vacuum environment.

A heat spreader (e.g., metal layer 501) may be deposited over integrated circuit die 503 via plating. In this scenario, the heat spreader may have a surface area that is similar to the maximum dimension of integrated circuit die 503, namely, the x-y dimension of the integrated circuit die 503, in a horizontal plane. This may allow efficient dissipation of heat from the surface area of integrated circuit die 503. If desired, another metal layer (e.g., metal layer 502) may be formed above metal layer 501 and covering the entire surface of metal layer 501 to provide additional heat transfer area to transfer heat out of in integrated circuit package 500.

Figure 6:
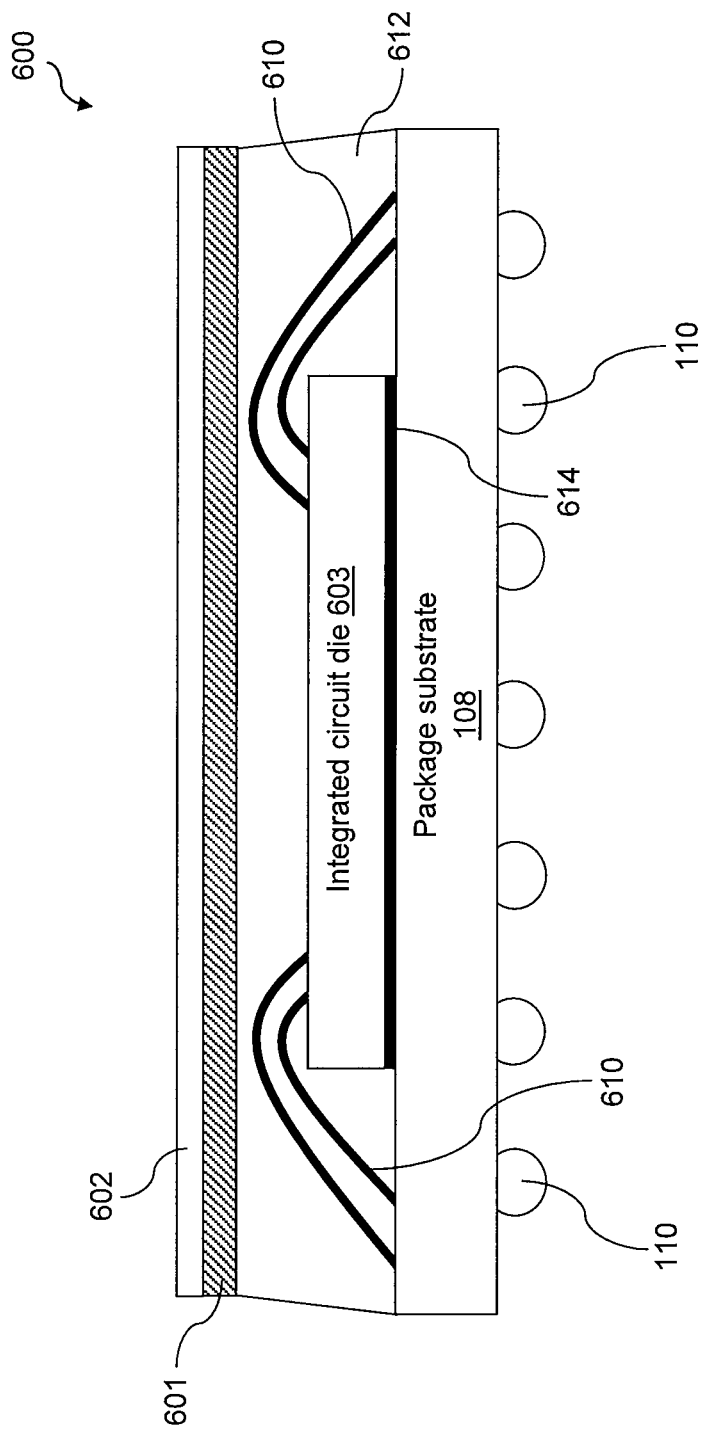
FIG. 6 shows a side view of an illustrative wire bond package, in accordance with an embodiment of the present invention.

FIG. 6 shows a side view of an illustrative wire bond package 600, in accordance with an embodiment of the present invention. It should be appreciated that wire bond package 600 may share similar elements with integrated circuit packages 100 of FIG. 1. As such, for the sake of brevity, elements that have been described above, such as package substrate 108 and solder balls 110, will not be described in detail. Wire bond package 600 may include integrated circuit die 603 that is attached to package substrate 108 through adhesive 614. Adhesive 614 may be an epoxy in the form of paste or glue or may be any desired adhesive materials.

Bonding wires such as bond wires 610 are electrically connected between bond pads (not shown in FIG. 6) on integrated circuit die 603 and package substrate 108. After the bonding of wires 610, overmold 612 is disposed over integrated circuit die 603, bond wires 610, and package substrate 108. Overmold 612 may prevent contamination of the electrical connections and may provide mechanical support to wire bond package 600.

A plating metal layer (e.g., metal layer 601) may be formed on overmold 612 to facilitate heat transfer from wire bond package 600. In one embodiment, metal layer 601 may be fabricated similar to metal layer 101 illustrated in FIG. 2. Metal layer 601 may have two different heat conducting layers (e.g., heat conducting layer 101A and 101B of FIG. 2) formed on top of overmold 612 via sputtering and plating process. The plating process may be an plating or a chemical plating process to form metal layer 601. For example, metal layer 601 may be formed from copper. If desired, an additional metal layer (e.g., metal layer 602) may be plated onto metal layer 601 to provide the look of a conventional lid as well as to protect integrated circuit die 603 from external contaminants.

Figure 7:
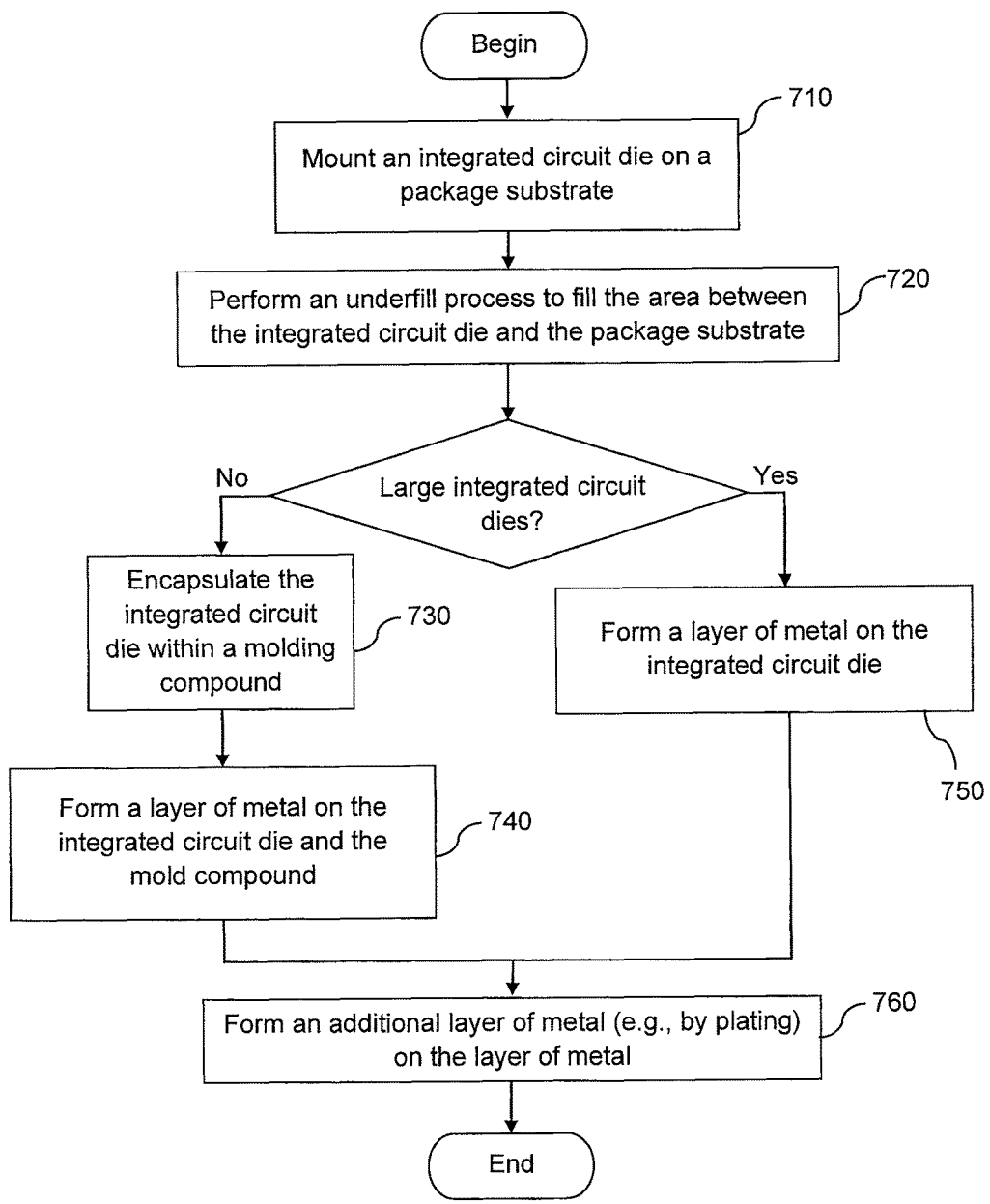
FIG. 7 is a flow chart of illustrative steps to assemble an integrated circuit package, in accordance with one embodiment of the present invention.

FIG. 7 is a flowchart of illustrative steps to assemble an integrated circuit package, in accordance with one embodiment of the present invention. At step 710, an integrated circuit die is mounted on a package substrate. As an example, as shown in FIG. 1, integrated circuit die 103 is mounted on package substrate 108. A reflow process may be performed so that integrated circuit die 103 is mechanically and electrically connected to package substrate 108 by solder bumps (e.g., microbumps 105). In the example shown in FIG. 1, microbumps 105 may be thermally reflowed at a reflow temperature of about 250° C.

At step 720, an underfill process is performed to fill the area between the integrated circuit die and the package substrate. For example, as shown in FIG. 1, underfill 106 is dispensed to fill a gap between integrated circuit die 103 and package substrate 108, so as to improve bonding between integrated circuit die 103 and package substrate 108.

For large integrated circuit dies, the integrated circuit die may be encapsulated within a molding compound at step 730. The molding compound may be deposited around the integrated circuit die while leaving an upper surface (e.g., surface 205 of FIG. 2) of the integrated circuit die exposed. Encapsulation may involve using a molding process to protect the integrated circuit die from mechanical and chemical damage. In one embodiment, the molding compound may be formed or molded into any desired shape. For example, as shown in FIG. 3, the shape of the cross-section of molding compound 120 that surrounds integrated circuit die 303 is a trapezoid. In another example, as shown in FIG. 4, the cross-section of molding compound 120 that surrounds integrated circuit die 403 is rectangular in shape.

Subsequently, a layer of metal is deposited on the integrated circuit die and the molding compound at step 740. The layer of metal may conform to the shape of molding compound 120 when the layer of metal is deposited (e.g., through plating) over the integrated circuit die and the molding compound. For example, as shown in FIG. 3, metal layer 301 is a "hat-shaped" metal layer. In another example, as shown in FIG. 4, metal layer 401 is a "rectangular-shaped" metal layer.

For large-sized integrated circuit dies (e.g., integrated circuit die 503 of FIG. 5), the integrated circuit die may not need to undergo a molding process. Instead, a layer of metal may be directly formed on the integrated circuit die at step 750. For example, as shown in FIG. 2, the layer of metal (e.g., metal layers 101, 301, 401, and 501 of FIGS. 1, 3, 4, and 5, respectively) may be made up of heat conducting layer 101A and heat conducting layer 101B. The layer of metal may transfer heat generated by the integrated circuit die from the integrated circuit package.

At step 760, an additional layer of metal is formed on the layer of metal. The additional metal layer (e.g., metal layers 102, 302, 402, and 502 of respective FIGS. 1, 3, 4, and 5) may be plated on the heat spreader layer (e.g., heat conducting layer 101B of FIG. 2) of the layer of metal to replicate a heat spreading lid to protect the integrated circuit die from external contaminants.

Figure 8:
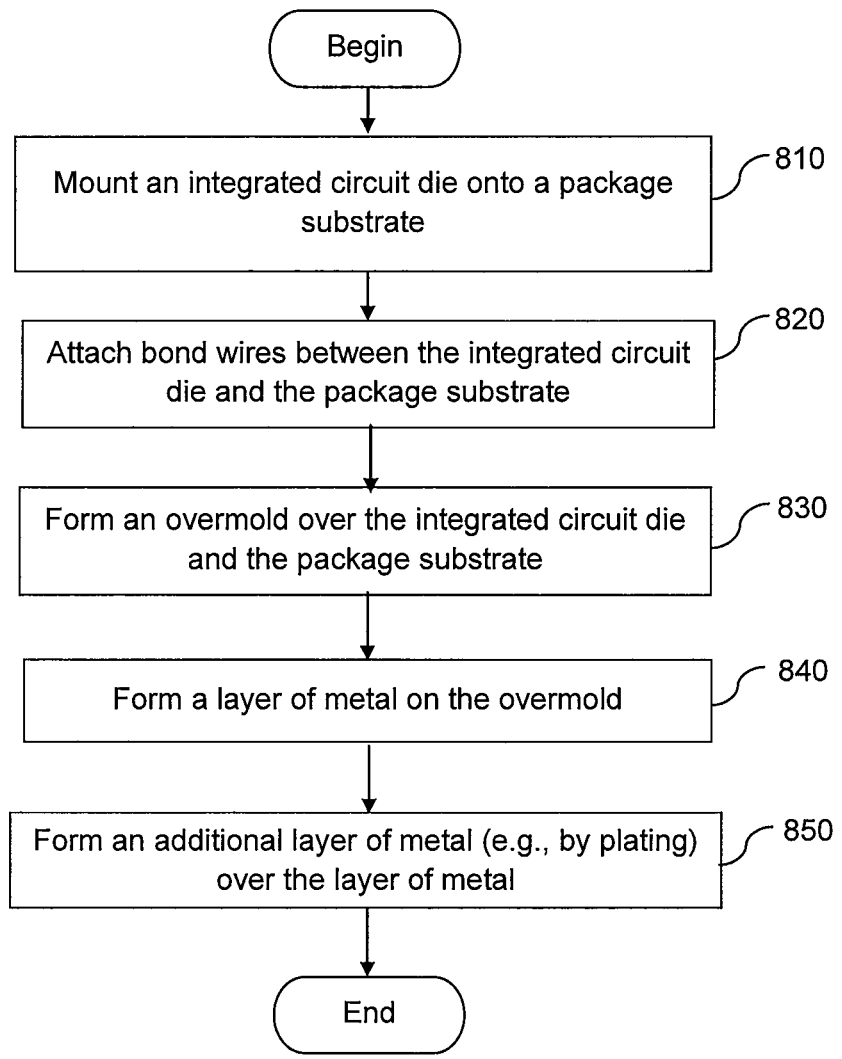
FIG. 8 is another flow chart of illustrative steps to assemble an integrated circuit package, in accordance with one embodiment of the present invention.

FIG. 8 is another flowchart of illustrative steps to assemble an integrated circuit package, in accordance with one embodiment of the present invention. The resultant integrated circuit package may be similar to wire bond package 600 of FIG. 6. It should be noted that dies of different sizes may be used during the respective assembly processes shown in FIGS. 7 and 8.

At step 810, an integrated circuit die is mounted onto a package substrate. The integrated circuit die may be attached to the package substrate through a layer of adhesive. For example, as shown in FIG. 6, integrated circuit die 601 is attached to package substrate 108 through adhesive 614.

At step 820, bond wires are attached between the integrated circuit die and the package substrate. This step may sometimes be referred to as "wire bonding". As an example, as shown in FIG. 6, bond wires 610 are attached to bond pads (not shown in the figure) on integrated circuit die 601 and package substrate 108.

At step 830, an overmold is formed over the integrated circuit die and the package substrate. The overmold may be an epoxy material. A molding process (e.g., an injection molding process) is performed to enclose the die assembly in an overmold (e.g., overmold 612 of FIG. 6) or a molding compound. During the molding process, the overmold may act as a protective layer that immobilizes the bond wires and prevents them from swaying. The bond wires, immobilized by the overmold, are thus prevented from short-circuiting during the molding process.

At step 840, a layer of metal is formed on the overmold. The layer of metal may be formed from a metal with high conductivity such as copper or aluminum. As shown in FIG. 6, the high conductivity of metal layer 601 may efficiently transfer heat out of wire bond package 600. At step 850, an additional layer of metal is formed over the layer of metal. The additional layer of metal may replicate a heat spreading lid to protect the integrated circuit die from external contaminants. It should be appreciated that step 850 are substantially similar to step 760, respectively. The actions performed are the same as those described above.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method of packaging an integrated circuit die, comprising:
   mounting the integrated circuit die on a package substrate to form an integrated circuit package;
   forming a metal layer on the integrated circuit package, wherein the metal layer directly contacts the integrated circuit die and includes first and second heat conducting layers of the same width; and
   forming molding compound between the metal layer and the package substrate.

2. The method defined in claim 1, wherein forming the metal layer on the integrated circuit package comprises:
   forming a first heat conducting layer on the integrated circuit die through a sputter deposition process; and
   forming a second heat conducting layer on the first heat conducting layer through a plating process.

3. The method defined in claim 1, wherein forming the molding compound comprises injecting the molding compound to surround the integrated circuit die while leaving an upper surface of the integrated circuit die exposed, and wherein the metal layer contacts the exposed upper surface of the integrated circuit die.

4. The method defined in claim 3, wherein forming the metal layer on the integrated circuit package includes forming the metal layer to cover the molding compound and the integrated circuit die.

5. The method defined in claim 4, further comprising:
   forming sloped side walls with a portion of the metal layer.

6. The method defined in claim 4, further comprising:
   forming vertical side walls with a portion of the metal layer.

7. The method defined in claim 1, wherein mounting the integrated circuit die on the package substrate comprises attaching the integrated circuit die to the package substrate through solder bumps.

8. The method defined in claim 3, further comprising:
   depositing an underfill material between the integrated circuit die and the package substrate.

9. A method of assembling an integrated circuit package comprising:
   attaching an integrated circuit die to a package substrate;
   bonding a plurality of wires to the integrated circuit die and the package substrate;
   encapsulating the integrated circuit die, the package substrate, and the plurality of wires with an overmold;
   forming a layer of metal to cover the overmold, wherein the layer of metal is formed entirely on a single plane; and
   forming an additional layer of metal above the layer of metal, wherein the additional layer of metal forms a heat spreading lid, and wherein the layer of metal and the additional layer of metal have the same width.

10. The method defined in claim 9, wherein forming the layer of metal comprises:
    forming a first heat conducting layer on the overmold through a sputter deposition process; and
    forming a second heat conducting layer on the first heat conducting layer through a plating process.

11. The method defined in claim 10, wherein the second heat conducting layer is thicker than the first heat conducting layer.

* * * * *